United States Patent
Maki et al.

(10) Patent No.: US 10,312,924 B2
(45) Date of Patent: Jun. 4, 2019

(54) TIMING SIGNAL GENERATION DEVICE, ELECTRONIC DEVICE, AND MOVING OBJECT

(71) Applicant: Seiko Epson Corporation, Tokyo (JP)

(72) Inventors: Yoshiyuki Maki, Suwa (JP); Hiroyuki Shimada, Suwa (JP)

(73) Assignee: Seiko Epson Corporation (JP)

( * ) Notice: Subject to any disclaimer, the term of this patent is extended or adjusted under 35 U.S.C. 154(b) by 216 days.

(21) Appl. No.: 15/378,440

(22) Filed: Dec. 14, 2016

(65) Prior Publication Data

US 2017/0179967 A1    Jun. 22, 2017

(30) Foreign Application Priority Data

Dec. 21, 2015 (JP) .................................. 2015-248843

(51) Int. Cl.
| | |
|---|---|
| *G04F 5/14* | (2006.01) |
| *H03L 1/02* | (2006.01) |
| *H03L 7/26* | (2006.01) |
| *G01S 19/37* | (2010.01) |
| *H03L 7/099* | (2006.01) |
| *H03L 7/183* | (2006.01) |

(Continued)

(52) U.S. Cl.
CPC ................ *H03L 7/26* (2013.01); *G01S 19/37* (2013.01); *G04F 5/14* (2013.01); *H03L 1/027* (2013.01); *H03L 7/099* (2013.01); *H03L 7/183* (2013.01); *G01S 19/14* (2013.01); *G01S 19/39* (2013.01)

(58) Field of Classification Search
CPC .......... G01S 19/14; G01S 19/23; G01S 19/37; G01S 19/39; G04F 5/14; G04F 5/145; H03B 5/04; H03B 17/00; H03L 1/002; H03L 1/02; H03L 1/027; H03L 7/26; H03L 7/183

USPC ............................................ 331/3, 94.1, 176
See application file for complete search history.

(56) References Cited

U.S. PATENT DOCUMENTS

| | | | | |
|---|---|---|---|---|
| 5,485,127 A | * | 1/1996 | Bertoluzzi | ............. H03L 1/027 331/14 |
| 5,604,468 A | * | 2/1997 | Gillig | ...................... H03L 1/026 327/105 |

(Continued)

FOREIGN PATENT DOCUMENTS

| | | |
|---|---|---|
| JP | H09-008551 A | 1/1997 |
| JP | 11-271476 A | 10/1999 |

(Continued)

*Primary Examiner* — Levi Gannon

(74) *Attorney, Agent, or Firm* — Harness, Dickey & Pierce, P.L.C.

(57) ABSTRACT

A timing signal generation device includes a GPS receiver, an atomic oscillator, a phase comparator, a loop filter, and a divider, a temperature sensor, a DDS, and a DSP. The GPS receiver outputs a reference timing signal. The atomic oscillator outputs a clock signal in accordance with an input voltage value. The phase comparator, the loop filter, and the divider adjust the voltage value in accordance with a synchronization status between the reference timing signal and the clock signal. The temperature sensor outputs a signal depending on the temperature of the atomic oscillator. The DDS converts the frequency of the clock signal and outputs a signal obtained by converting the frequency. The DSP controls the DDS based on an output of the temperature sensor.

20 Claims, 11 Drawing Sheets

(51) Int. Cl.
  *G01S 19/14* (2010.01)
  *G01S 19/39* (2010.01)

(56) References Cited

U.S. PATENT DOCUMENTS

| | | | | |
|---|---|---|---|---|
| 5,798,667 | A * | 8/1998 | Herbert | G06F 1/206 327/115 |
| 6,081,163 | A * | 6/2000 | Ujiie | G01S 19/235 331/11 |
| 6,426,679 | B1 | 7/2002 | Oblak et al. | |
| 6,570,455 | B2 | 5/2003 | Atsumi et al. | |
| 8,736,394 | B2 | 5/2014 | Kowada | |
| 2004/0232997 | A1* | 11/2004 | Hein | H03L 1/022 331/16 |
| 2005/0062552 | A1* | 3/2005 | Deng | H01S 1/06 331/94.1 |
| 2005/0068115 | A1 | 3/2005 | Atsumi et al. | |
| 2007/0241097 | A1* | 10/2007 | Shibata | G04F 5/14 219/492 |
| 2007/0247241 | A1* | 10/2007 | Braun | G04F 5/14 331/94.1 |
| 2009/0302956 | A1* | 12/2009 | Matsuura | H03L 1/022 331/94.1 |
| 2015/0180491 | A1 | 6/2015 | Tanaka | |
| 2015/0358026 | A1* | 12/2015 | Gan | G04F 5/14 331/94.1 |

FOREIGN PATENT DOCUMENTS

| | | |
|---|---|---|
| JP | 2002-271197 A | 9/2002 |
| JP | 2005-109619 A | 4/2005 |
| JP | 2010-068065 A | 3/2010 |
| JP | 2010-193240 A | 9/2010 |
| JP | 2011-155367 A | 8/2011 |
| JP | 2011-244120 A | 12/2011 |
| JP | 5398200 B2 | 1/2014 |
| JP | 2015-122598 A | 7/2015 |
| JP | 2015-175812 A | 10/2015 |
| WO | WO-2011-086976 A1 | 7/2011 |

* cited by examiner

TIMING SIGNAL GENERATION DEVICE, ELECTRONIC DEVICE, AND MOVING OBJECT

CROSS-REFERENCE TO RELATED APPLICATION

This application claims the benefit of Japanese Application No. 2015-248843, filed on Dec. 21, 2015. The disclosure of the prior application is hereby incorporated by reference herein in its entirety.

BACKGROUND

1. Technical Field

The present invention relates to a timing signal generation device, an electronic device, and a moving object.

2. Related Art

A timing signal generation device which performs synchronization with a precise timing signal included in a satellite signal and the like from, for example, a global positioning system (GPS) satellite, causes an oscillator such as a crystal oscillator or an atomic oscillator to oscillate, and thus generates a highly-precise timing signal has been known (for example, see JP-A-2010-68065).

Here, generally, an oscillator such as a crystal oscillator or an atomic oscillator has frequency-temperature characteristics (fluctuation characteristics of an output frequency with respect to a change of a temperature). In a timing signal generation device, the fluctuation of an output frequency occurring by the frequency-temperature characteristics is corrected.

For example, the timing signal generation device disclosed in JP-A-2010-68065 includes a crystal oscillator, a control unit, and a temperature detection unit.

The crystal oscillator applies a voltage signal to a crystal resonator, so as to generate a reference frequency signal. The control unit generates the voltage signal. The temperature detection unit detects the temperature of the crystal oscillator, and outputs the detected temperature to the control unit. In the timing signal generation device disclosed in JP-A-2010-68065, the control unit calculates a time-variant state of the temperature from time-series temperatures which are sequentially acquired and stored. The control unit corrects a signal level of the voltage signal based on the time-variant state of the temperatures and the current temperature. Then, the control unit applies the voltage signal having the corrected signal level, to the crystal oscillator.

In the timing signal generation device disclosed in JP-A-2010-68065, the voltage signal to be applied to the crystal resonator is corrected in accordance with the temperature of the crystal oscillator. Thus, in a case where linearity of an output frequency to a voltage value of the voltage signal of the crystal resonator is bad, a problem in that correction accuracy depending on fluctuation of the voltage value of the voltage signal is deteriorated with time occurs. In a case where an atomic oscillator is used as an oscillator for a request of a very highly precise form such as terrestrial digital broadcasting and a portable phone base station, since linearity of an oscillation frequency to a control voltage of the atomic oscillator is bad, such a problem is particularly significantly shown.

SUMMARY

An advantage of some aspects of the invention is to provide a timing signal generation device which can generate a highly precise timing signal for a long term even though temperature fluctuation under an installation environment occurs, and to provide an electronic device and a moving object which include the timing signal generation device.

Such an advantage can be achieved by the following configurations.

A timing signal generation device according to an aspect of the invention includes a reference timing signal output unit that outputs a reference timing signal, an atomic oscillator that outputs a clock signal in accordance with an input voltage value, a voltage adjustment unit that adjusts the voltage value in accordance with a synchronization status between the reference timing signal and the clock signal, a temperature sensor that outputs a signal depending on the temperature of the atomic oscillator, a frequency conversion unit that converts a frequency of the clock signal, and outputs a signal obtained by the frequency conversion, and a control unit that controls the frequency conversion unit based on an output of the temperature sensor.

According to such a timing signal generation device, the control unit controls the frequency conversion unit based on an output of the temperature sensor, and thus it is possible to reduce fluctuation of an output frequency of the timing signal generation device, occurring by frequency-temperature characteristics of the atomic oscillator (fluctuation characteristics of an output frequency with respect to a change of a temperature). In particular, since the frequency conversion unit converts the frequency of the clock signal of the atomic oscillator, even though an atomic oscillator having bad linearity of the output frequency to a voltage value to be input (control voltage), it is possible to easily correct the output frequency of the timing signal generation device with high precision for a long term. Even when the reference timing signal output unit is in a situation in which outputting the reference timing signal is not possible, it is possible to generate a highly-precise timing signal by using the clock signal of the atomic oscillator. Thus, even when temperature fluctuation under an installation environment occurs, it is possible to generate a clock signal as a highly-precise timing signal, for a long term.

In the timing signal generation device according to the aspect of the invention, it is preferable that the atomic oscillator includes an atomic cell in which an atom is enclosed, a coil which applies a magnetic field to the atom in accordance with the voltage value, and a voltage-controlled oscillator which outputs the clock signal in accordance with a transition frequency of the atom.

In such an atomic oscillator, because the output frequency (frequency of the clock signal) is changed in proportion to the square of the voltage value, linearity of the output frequency to the voltage value (control voltage) which is input to the atomic oscillator is bad. Thus, if a voltage value input to the coil is adjusted, and thus the frequency-temperature characteristics are corrected, correction accuracy of the frequency-temperature characteristics is deteriorated with time, due to aging characteristics, or huge correction data for the frequency-temperature characteristics to which the aging characteristics are applied is necessarily held. In addition, complex control is needed. Accordingly, in a case of using such an atomic oscillator, if the aspect of the invention is applied, the effect is significantly shown.

In the timing signal generation device according to the aspect of the invention, it is preferable that an output unit that outputs a timing signal outwardly is provided, and the frequency conversion unit is provided between the atomic oscillator and the output unit.

With this configuration, it is possible to output the corrected clock signal as the timing signal from the output unit, with a relatively simple configuration.

In the timing signal generation device according to the aspect of the invention, it is preferable that the frequency conversion unit is a direct digital synthesizer.

With this configuration, it is possible to simply convert the frequency of the clock signal so as to correct the clock signal with high precision.

In the timing signal generation device according to the aspect of the invention, it is preferable that the atomic oscillator includes a light source unit that emits a resonance light pair for exciting the atom, a light-receiving unit that receives the resonance light pair which has passed through the atomic cell, a frequency control unit that controls an oscillation frequency of the voltage-controlled oscillator based on a light reception result of the light-receiving unit, and a multiplying unit that multiplies the clock signal and outputs a signal obtained by multiplying the clock signal. In addition, it is preferable that the light source unit is driven by using an output of the multiplying unit, and the frequency conversion unit is provided in the multiplying unit.

With this configuration, it is possible to output the corrected clock signal from the atomic oscillator.

In the timing signal generation device according to the aspect of the invention, it is preferable that the frequency conversion unit is a fractional phase synchronization circuit.

With this configuration, it is possible to simply convert the frequency of the clock signal so as to correct the clock signal with high precision.

In the timing signal generation device according to the aspect of the invention, it is preferable that the voltage adjustment unit includes a divider that divides and outputs the clock signal, a phase comparator that compares a phase of an output of the divider and a phase of the reference timing signal, and a loop filter which is provided between the phase comparator and the atomic oscillator. In addition, it is preferable that the frequency conversion unit is provided in the divider.

With this configuration, it is possible to output the corrected clock signal from the atomic oscillator, with a relatively simple configuration.

In the timing signal generation device according to the aspect of the invention, it is preferable that a storage unit that stores correction information regarding frequency-temperature characteristics of the atomic oscillator is provided. In addition, it is preferable that the control unit controls the frequency conversion unit based on the correction information and the output of the temperature sensor.

With this configuration, it is possible to accurately correct the clock signal in accordance with the frequency-temperature characteristics of the atomic oscillator.

In the timing signal generation device according to the aspect of the invention, it is preferable that the reference timing signal output unit outputs the reference timing signal based on a satellite signal.

With this configuration, it is possible to use an accurate reference timing signal (1 PPS) synchronized with the coordinated universal time (UTC).

An electronic device according to another aspect of the invention includes the timing signal generation device according to the aspect of the invention.

With this configuration, it is possible to provide an electronic device including a timing signal generation device which can generate a highly precise timing signal for a long term even though temperature fluctuation under an installation environment occurs.

A moving object according to still another aspect of the invention includes the timing signal generation device according to the aspect of the invention.

With this configuration, it is possible to provide a moving object including a timing signal generation device which can generate a highly precise timing signal for a long term even though temperature fluctuation under an installation environment occurs.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a timing signal generation device, an electronic device, and a moving object according to the invention will be described in detail, based on an embodiment illustrated in the accompanying drawings.

1. Timing Signal Generation Device

Figure 1:
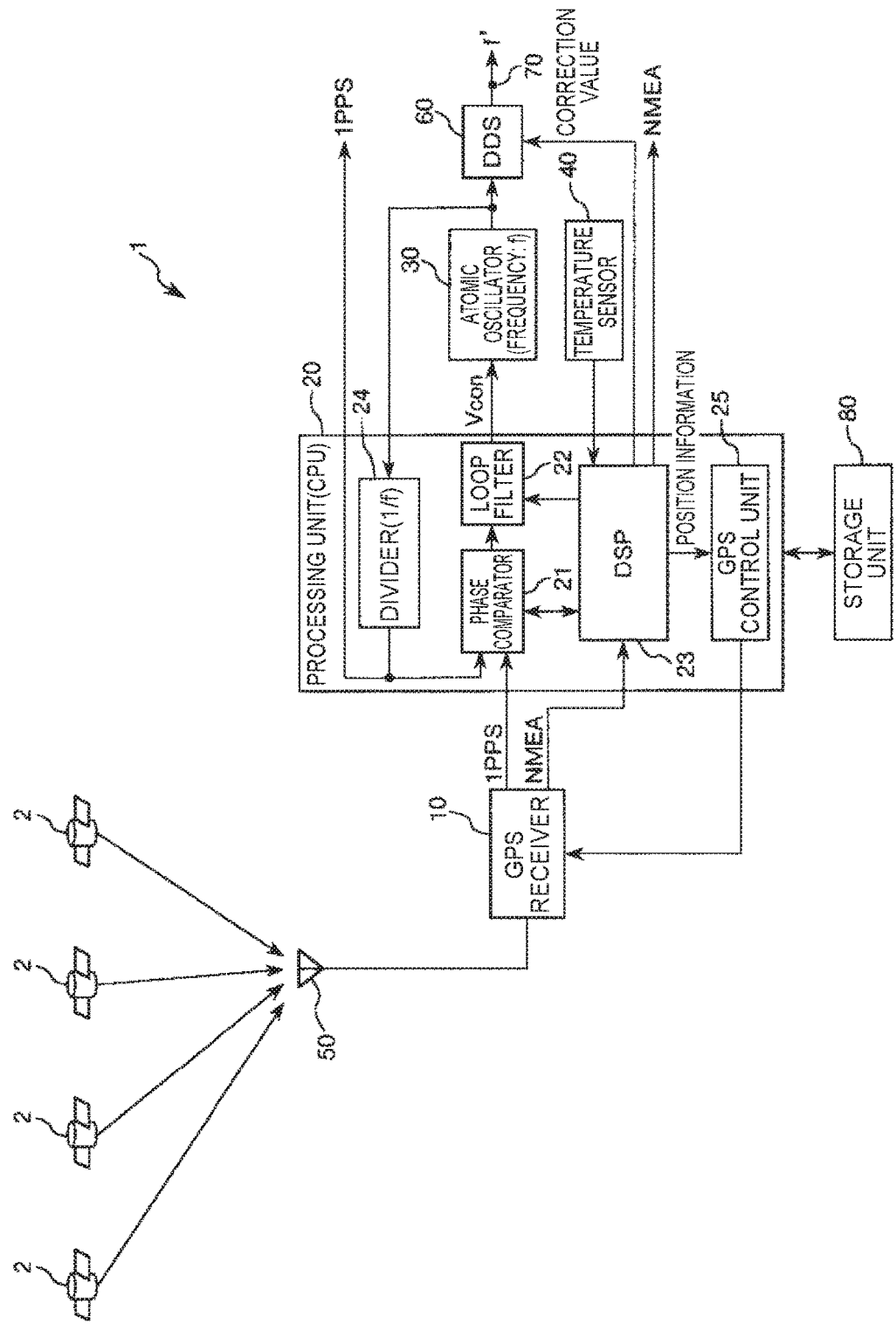
FIG. 1 is a schematic diagram illustrating a configuration of a timing signal generation device according to a first embodiment of the invention.

FIG. 1 is a schematic diagram illustrating a configuration of a timing signal generation device according to a first embodiment of the invention.

A timing signal generation device 1 illustrated in FIG. 1 includes a GPS receiver (reference timing signal output unit) 10, a processing unit (CPU) 20, an atomic oscillator (oscillator) 30, a temperature sensor 40, a GPS antenna 50, a direct digital synthesizer (DDS) (frequency conversion unit) 60, and a storage unit 80.

Some or all of the components of the timing signal generation device 1 may be physically separated or may be integrated. For example, each of the GPS receiver 10 and the processing unit (CPU) 20 may be realized by using an individual IC. The GPS receiver 10 and the processing unit (CPU) 20 may be realized as a one-chip IC.

The timing signal generation device 1 receives a satellite signal transmitted from a GPS satellite (an example of a position information satellite) 2, and generates 1 PPS with high precision.

The GPS satellite 2 revolves on a predetermined orbit over the Earth and transmits a satellite signal to the ground. The satellite signal is obtained by superimposing a navigation message and a C/A (coarse/acquisition) code on a radio wave (L1 wave) of 1.57542 GHz serving as a carrier wave (by modulating the carrier wave).

The C/A code is used for identifying satellite signals of GPS satellites 2 of which the number is currently about 30. The C/A code has a unique pattern formed from 1023 chips (cycle of 1 ms) each of which has a value of either of +1 and −1. Accordingly, correlation between the satellite signal and the pattern of the C/A code is obtained, and thus, it is possible to detect a C/A code superimposed on the satellite signal.

The satellite signal (specifically, navigation message) transmitted by each of the GPS satellite 2 includes orbit information indicating a position of the corresponding GPS satellite 2 on an orbit thereof. Each of the GPS satellites 2 has an atomic clock mounted therein and the satellite signal includes very precise time information clocked by the atomic clock. Accordingly, satellite signals are received from four or more GPS satellites 2, positioning calculation is performed by using orbit information and time information which are included in each of the received satellite signals, and thus it is possible to obtain accurate information about a position and a point of time of a reception point (installation place of the GPS antenna 50). Specifically, a quartic equation in which a three-dimensional position (x, y, z) of the reception point and a point t of time function as four variables may be established and the solution thereof may be obtained.

In a case where the position of a reception point is already known, satellite signals may be received from one GPS satellite 2 or more, and time information at the reception point may be obtained by using time information included in each of the satellite signals.

Information about a difference between a point of time in each of the GPS satellites 2 and a point of time at the reception point may be obtained by using orbit information included in each of the satellite signals. A control segment on the ground measures a small time error of the atomic clock mounted in each of the GPS satellites 2, and the satellite signal also includes a time correction parameter for correcting the time error. Accordingly, a point of time at the reception point is corrected by using the time correction parameter, and thus very precise time information may be obtained.

The GPS antenna 50 is an antenna for receiving various radio waves which include a satellite signal. The GPS antenna 50 is connected to the GPS receiver 10.

GPS Receiver (Reference Timing Signal Output Unit)

The GPS receiver (reference timing signal output unit) 10 performs various types of processing based on the satellite signal received through the GPS antenna 50.

Specifically, the GPS receiver 10 has a normal positioning mode and a position fix mode. Either of the normal positioning mode and the position fix mode is set in accordance with a control command from the processing unit (CPU) 20.

In the normal positioning mode, the GPS receiver 10 receives satellite signals transmitted from a plurality (preferably, 4 or more) of GPS satellites 2, and performs positioning calculation based on orbit information (specifically, the ephemeris data, the almanac data, or the like which is described above), and time information (specifically, the week number data, the Z count data, or the like which is described above) which are included in the received satellite signal. The normal positioning mode is a mode in which the positioning calculation is continuously performed.

In the position fix mode, the GPS receiver 10 receives satellite signals transmitted from at least one GPS satellite 2, and generates 1 pulse per second (1 PPS) as "a reference timing signal", based on orbit information and time information which are included in the received satellite signals, and position information of the reception point which has been set. 1 PPS (an example of a reference timing signal synchronized with the reference point of time) is a pulse signal which has been completely synchronized with the coordinated universal time (UTC) and includes one pulse for each second. In this manner, the satellite signal used in generation of a reference timing signal by the GPS receiver 10 includes the orbit information and the time information, and thus a timing signal which is precisely synchronized with the reference point of time can be generated. The position fix mode is a mode in which 1 PPS is output based on preset position information.

Next, a configuration of the GPS receiver 10 will be described in detail.

Figure 2:
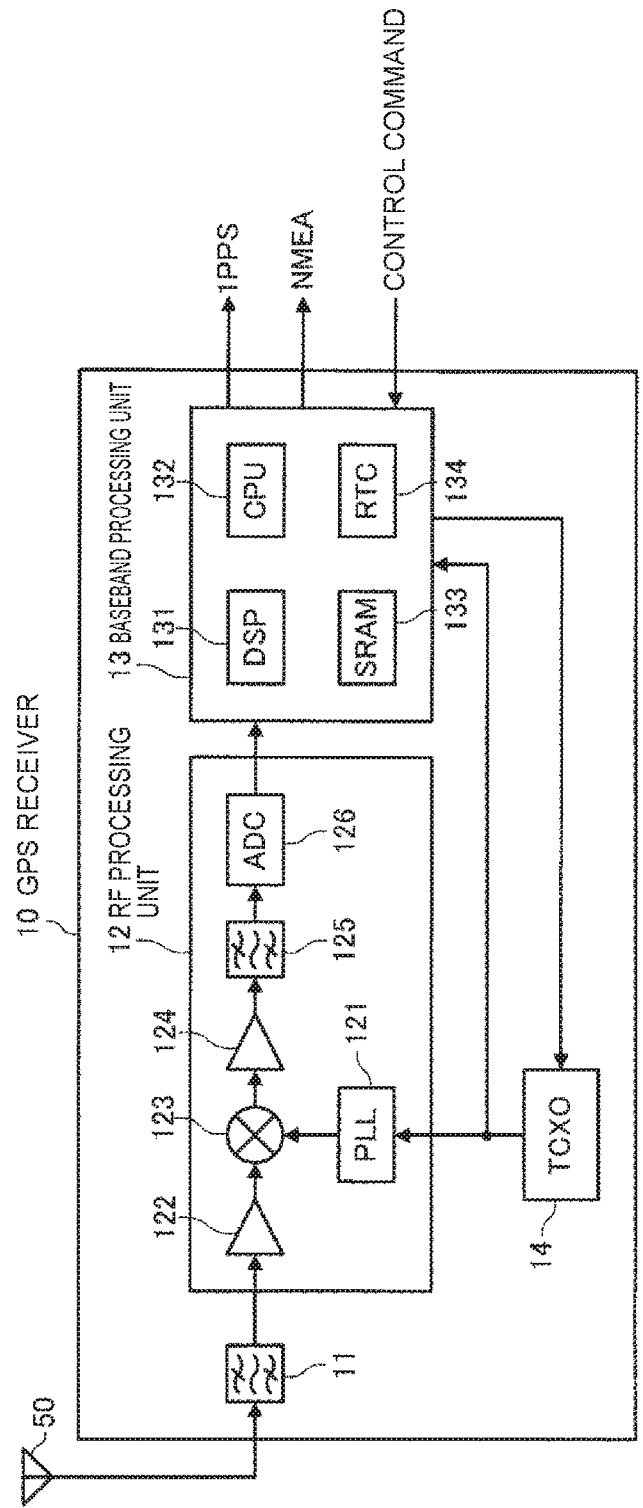
FIG. 2 is a block diagram illustrating a configuration example of a GPS receiver in the timing signal generation device illustrated in FIG. 1.

FIG. 2 is a block diagram illustrating a configuration example of the GPS receiver provided in the timing signal generation device illustrated in FIG. 1.

The GPS receiver 10 illustrated in FIG. 2 includes a surface acoustic wave (SAW) filter 11, an RF processing unit 12, a baseband processing unit 13, and a temperature compensated crystal oscillator (TCXO) 14.

The SAW filter 11 performs processing of extracting a satellite signal from a radio wave received by the GPS antenna 50. The SAW filter 11 is configured as a bandpass filter through which a signal in a band of 1.5 GHz passes.

The RF processing unit 12 includes a phase locked loop (PLL) 121, a low noise amplifier (LNA) 122, a mixer 123, an IF amplifier 124, an intermediate frequency (IF) filter 125, and an A/D converter (ADC) 126.

The PLL 121 generates a clock signal obtained by multiplying an oscillation signal of the TOXO 14, which is oscillated at about tens of MHz so as to have a frequency of 1.5 GHz.

The LNA 122 amplifies the satellite signal extracted by the SAW filter 11. The mixer 123 mixes the satellite signal amplified by the LNA 122 with the clock signal output by the PLL 121, and thus the amplified satellite signal is down-converted into a signal (IF signal) in an intermediate frequency band (for example, several MHz). The signal obtained by mixing of the mixer 123 is amplified by the IF amplifier 124.

Since mixing of the mixer 123 causes a high frequency signal of the GHz order to be generated along with the IF signal, the IF amplifier 124 amplifies this high frequency signal along with the IF signal. The IF filter 125 has the IF signal passed through and removes the high frequency signal (accurately, causes to be attenuated to be equal to or less than a predetermined level). The IF signal which passes through the IF filter 125 is converted into a digital signal by the A/D converter (ADC) 126.

The baseband processing unit 13 includes a digital signal processor (DSP) 131, a central processing unit (CPU) 132, a static random access memory (SRAM) 133, and a real-time clock (RTC) 134. The baseband processing unit 13 performs various types of processing by using the oscillation signal of the TCXO 14 as a clock signal.

The DSP 131 and the CPU 132 demodulates a baseband signal from the IF signal, obtains orbit information or time information which is included in a navigation message, and performs processing of the normal positioning mode or processing of the position fix mode, while cooperating with each other.

The SRAM 133 is used for storing the time information or the orbit information which is obtained, position information of the reception point which is set in accordance with a predetermined control command (control command for setting a position), an elevation angle mask used in, for example, the position fix mode, and the like. The RTC 134 generates a timing for performing baseband processing. A value of the RTC 134 is counted up by using a clock signal from the TCXO 14.

Specifically, the baseband processing unit 13 generates a local code having a pattern the same as each C/A code, and performs processing (satellite searching) of obtaining correlation between each C/A code included in the baseband signal, and the local code. The baseband processing unit 13 adjusts a timing of generating the local code such that a correlation value with respect to each of local codes becomes a peak. In a case where the correlation value is equal to or greater than a threshold value, the baseband processing unit 13 determines that synchronization with a GPS satellite 2 of which the local code corresponds to the C/A code is performed (the GPS satellite 2 is acquired). In the GPS, a code division multiple access (CDMA) method is employed. In the CDMA method, all GPS satellites 2 transmit satellite signals having the same frequency, by using different C/A codes. Accordingly, the C/A code included in the received satellite signal is determined and thus an acquirable GPS satellite 2 may be searched for.

The baseband processing unit 13 performs processing of mixing a local code having the same pattern as the C/A code of the acquired GPS satellite 2, with the baseband signal in order to obtain orbit information or time information of the acquired GPS satellite 2. A signal obtained by mixing includes a navigation message which includes the orbit information or the time information of the acquired GPS satellite 2 and is demodulated. The baseband processing unit 13 performs processing of obtaining the orbit information or the time information included in the navigation message, and storing the obtained information in the SRAM 133.

The baseband processing unit 13 receives a predetermined control command (specifically, control command for setting a mode), and performs setting of either of the normal positioning mode and the position fix mode. In the normal positioning mode, the baseband processing unit 13 performs positioning calculation by using pieces of the orbit information and the time information of four or more GPS satellites 2, which are stored in the SRAM 133.

In the position fix mode, the baseband processing unit 13 outputs 1 PPS which is high precise, by using pieces of orbit information of one GPS satellites 2 or more, which are stored in the SRAM 133, and the position information of the reception point stored in the SRAM 133. Specifically, the baseband processing unit 13 includes an 1-PPS counter in a portion of the RTC 134. The 1-PPS counter counts a timing of generating a pulse at 1 PPS. The baseband processing unit 13 calculates a propagation delay period required for causing a satellite signal transmitted from the GPS satellite 2 to reach the reception point, by using the orbit information of the GPS satellite 2 and the position information of the reception point. The baseband processing unit 13 changes a setting value of the 1-PPS counter to the optimum value based on the calculated propagation delay period.

In the normal positioning mode, the baseband processing unit 13 may output 1 PPS based on the time information of the reception point obtained through the positioning calculation. In the position fix mode, if a plurality of GPS satellites 2 is acquired, the positioning calculation may be performed.

The baseband processing unit 13 outputs NMEA data which includes various types of information such as the position information or the time information obtained as results of the positioning calculation, and a reception status (the number of acquired GPS satellites 2, intensity of the satellite signal, and the like).

An operation of the GPS receiver 10 configured as described above is controlled by the processing unit (CPU) 20 illustrated in FIG. 1.

Processing Unit

The processing unit 20 transmits various control commands to the GPS receiver 10 so as to control the operation of the GPS receiver 10. The processing unit 20 receives 1 PPS or the NMEA data which is output by the GPS receiver 10, and performs various types of processing. The processing unit 20 may perform various types of processing in accordance with, for example, a program stored in the storage unit 80.

The processing unit 20 includes a phase comparator 21, a loop filter 22, a digital signal processor (DSP) (control unit) 23, a divider 24, and a GPS control unit 25. The DSP 23 and the GPS control unit 25 may be configured by one component.

The DSP 23 (an example of a position information generation unit) obtains NMEA data from the GPS receiver 10 periodically (for example, for each second). The DSP 23 collects pieces of position information (result of the positioning calculation in the normal positioning mode by the GPS receiver 10) included in pieces of NMEA data, and creates statistical information for a predetermined period. The DSP 23 performs processing of generating position information of the reception point based on the created statistical information.

The DSP 23 has a function of controlling the DDS 60 based on an output of the temperature sensor 40. More specifically, the DSP 23 obtains a correction value by using the output of the temperature sensor 40 and correction information regarding the frequency-temperature characteristics which are stored in the storage unit 80. The DSP 23 inputs the obtained correction value to the DDS 60, and thus adjusts a setting value of the DDS 60. Control of the DDS 60 will be described later in detail along with descriptions for frequency correction of the clock signal of the atomic oscillator 30, which will be made later.

The GPS control unit 25 transmits various control commands to the GPS receiver 10 so as to control an operation of the GPS receiver 10. Specifically, the GPS control unit 25 transmits a control command for setting a mode to the GPS receiver 10, and performs processing of causing the mode of the GPS receiver 10 to be switched from the normal positioning mode to the position fix mode. Before the GPS control unit 25 switches the mode of the GPS receiver 10 from the normal positioning mode to the position fix mode, the GPS control unit 25 transmits a control command for setting a position to the GPS receiver 10, and performs processing of setting the position information of the reception point, which has been generated by the DSP 23, in the GPS receiver 10.

The divider 24 performs f-division of the clock signal (frequency: f) output by the atomic oscillator 30, and outputs a division clock signal of 1 Hz.

The phase comparator 21 compares a phase of 1 PPS (reference timing signal) output by the GPS receiver 10, and a phase of the 1 Hz division clock signal (clock signal) output by the divider 24. The phase comparator 21 outputs a phase difference signal of a voltage value $V_{con}$ depending on the phase difference as a comparison result. The phase difference signal is input to the atomic oscillator 30 through the loop filter 22. The parameter of the loop filter 22 is set by the DSP 23.

The 1 Hz division clock signal output by the divider 24 is synchronized with 1 PPS output by the GPS receiver 10. The timing signal generation device 1 outputs this 1 Hz division clock signal output by the divider 24, as 1 PPS which has been synchronized with the UTC and has very high frequency accuracy, to the outside of the device 1. The timing signal generation device 1 outputs the latest NMEA data outwardly for each second, with synchronization with 1 PPS.

The atomic oscillator 30 is configured to enable fine adjustment of a frequency in accordance with an output voltage (control voltage) of the loop filter 22. As described above, the phase comparator 21, the loop filter 22, the DSP 23, and the divider 24 cause the clock signal output by the atomic oscillator 30 to be completely synchronized with 1 PPS output by the GPS receiver 10. That is, the phase comparator 21, the loop filter 22, the DSP 23, and the divider 24 constitute a phase locked loop (PLL) circuit, and function as "a synchronization control unit". The synchronization control unit synchronizes the clock signal output by the atomic oscillator 30, with 1 PPS. The phase comparator 21, the loop filter 22, the DSP 23, and the divider 24 function as "a voltage adjustment unit". The voltage adjustment unit adjusts a voltage value input to the atomic oscillator 30, in accordance with a synchronization status between the reference timing signal from the GPS receiver 10 and the clock signal from the atomic oscillator 30.

Atomic Oscillator (Oscillator)

The atomic oscillator 30 is an oscillator that enables an output of a clock signal having high frequency accuracy by using atomic energy transition of, for example, a rubidium atom or a cesium atom. Examples of the atomic oscillator 30 may include an atomic oscillator using an electromagnetically induced transparency (EIT) phenomenon (may be also referred to as "a coherent population trapping (CPT) phenomenon), an atomic oscillator using an optical microwave double resonance phenomenon, and the like.

A configuration of the atomic oscillator 30 having a type of using the EIT phenomenon will be described below in detail.

Figure 3:
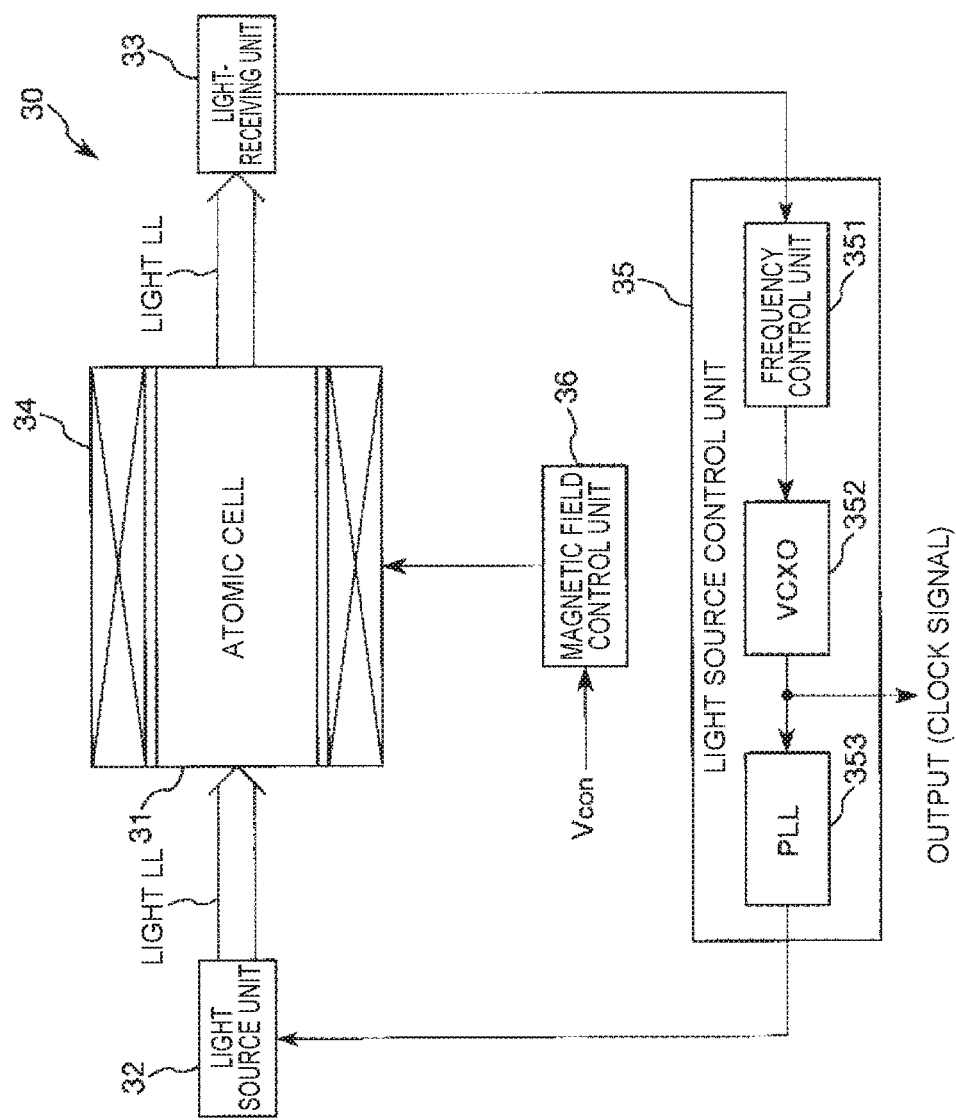
FIG. 3 is a schematic configuration diagram illustrating an atomic oscillator in the timing signal generation device illustrated in FIG. 1.
Figure 4:
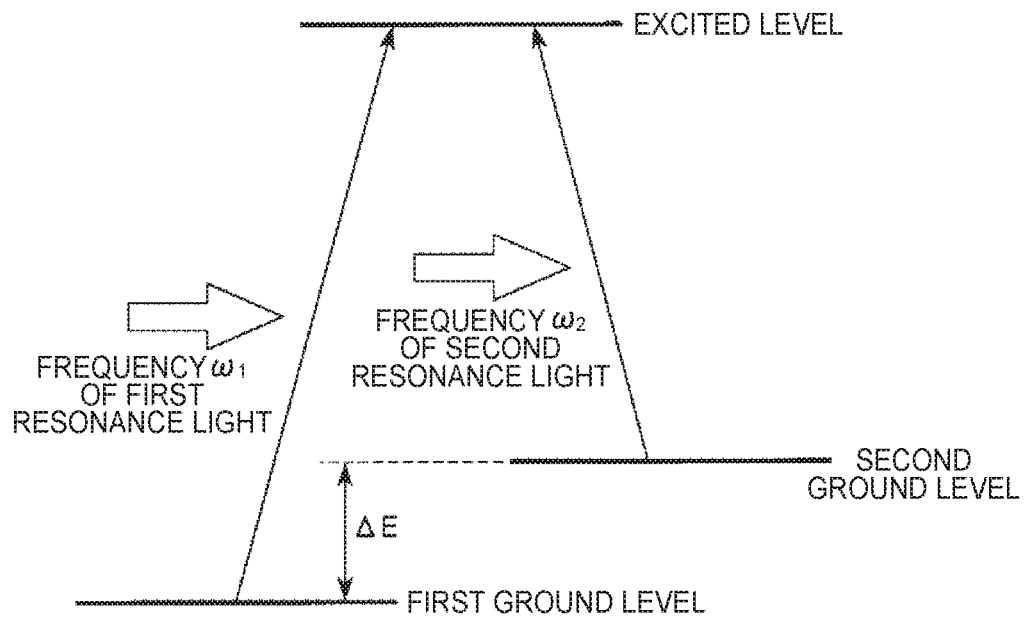
FIG. 4 is a diagram illustrating an energy state of alkali metal.
Figure 5:
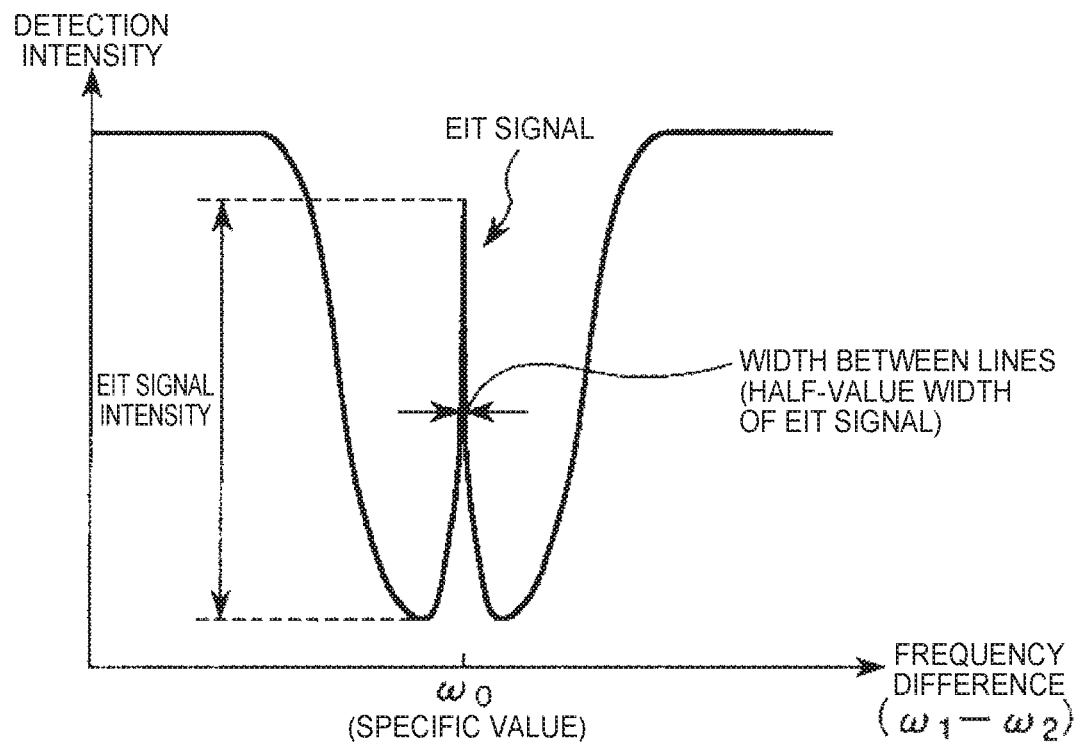
FIG. 5 is a graph illustrating a relationship between a frequency difference between two light beams emitted from a light source unit, and intensity of light detected by a light-receiving unit.

FIG. 3 is a schematic configuration diagram illustrating the atomic oscillator in the timing signal generation device illustrated in FIG. 1. FIG. 4 is a diagram illustrating an energy state of alkali metal. FIG. 5 is a graph illustrating a relationship between a frequency difference between two light beams emitted from a light source unit, and intensity of light detected by a light-receiving unit.

As illustrated in FIG. 3, the atomic oscillator 30 includes an atomic cell (gas cell) 31, a light source unit 32, a light-receiving unit 33, a coil 34, a light source control unit 35, and a magnetic field control unit 36.

The atomic cell 31 is formed by glass, for example. The atomic cell 31 has a closed internal space. Gaseous alkali metal such as gaseous rubidium, gaseous cesium, and gaseous sodium is enclosed in the atomic cell 31. If necessary, a rare gas such as argon and neon, an inert gas such as nitrogen may be enclosed as a buffer gas, along with alkali metal in the atomic cell 31. Here, the atomic cell 31 is heated by a heater (not illustrated) which is driven based on a detection result of a temperature sensor (not illustrated). The temperature sensor is used for detecting the temperature of the atomic cell 31. Thus, it is possible to maintain gaseous alkali metal in the atomic cell 31 to have an appropriate concentration.

As illustrated in FIG. 4, the alkali metal has an energy level of a three-state system, and may take three states, that is, two ground states (first ground level and second ground level) having different energy levels, and an excited state. Here, the first ground level is an energy level lower than the second ground level. When alkali metal is irradiated with two types of first resonance light and second resonance light, a light absorption factor (light transmittance) of the first resonance light and the second resonance light in the alkali metal is changed in accordance with a difference ($\omega_1 - \omega_2$) between a frequency $\omega_1$ of the first resonance light and a frequency $\omega_2$ of the second resonance light.

When the difference ($\omega_1 - \omega_2$) between the frequency $\omega_1$ of the first resonance light and the frequency $\omega_2$ of the second resonance light coincides with a frequency corresponding to an energy difference between the first ground level and the second ground level, excitation from each of the first ground level and the second ground level to an excited level is stopped. At this time, the first resonance light and the second resonance light are transmitted through the alkali metal without being absorbed in the alkali metal. Such a phenomenon is referred to as the CPT phenomenon or the electromagnetically induced transparency (EIT) phenomenon.

For example, if the frequency $\omega_1$ of the first resonance light is fixed, and the frequency $\omega_2$ of the second resonance light is changed, when the difference ($\omega_1 - \omega_2$) between the frequency $\omega_1$ of the first resonance light and the frequency $\omega_2$ of the second resonance light coincides with a frequency $\omega_0$ corresponding to an energy difference between the first ground level and the second ground level, light receiving intensity (detection intensity) of the light-receiving unit 33 is rapidly increased by the above-described EIT phenomenon, as illustrated in FIG. 5. Such a steep signal is detected as an EIT signal. The EIT signal has an eigenvalue determined by the type of the alkali metal.

The light source unit 32 illustrated in FIG. 3 has a function of emitting light LL. The light LL includes the first resonance light and the second resonance light which are described above and constitute resonance light pair for resonating (exciting) an alkali metal atom in the atomic cell 31. The light source unit 32 is not particularly limited as long as the light source unit may emit light LL as described above. For example, as the light source unit 32, semiconductor laser such as a vertical-cavity surface emitting laser (VCSEL) may be used.

The light-receiving unit 33 has a function of receiving the light LL (particularly, resonance light pair constituted by the first resonance light and the second resonance light) which has been transmitted though the atomic cell 31, and of detecting intensity of the received light. The light-receiving unit 33 is not particularly limited as long as the light-receiving unit may detect intensity of the above-described light LL. For example, a photodetector (light receiving element) such as a photodiode may be used.

The coil 34 has a function of performing electrification and applying a magnetic field to the alkali metal in the atomic cell 31. Thus, gaps between a plurality of different degenerated energy levels of the alkali metal atom in the atomic cell 31 are extended by Zeeman splitting. Thus, it is possible to improve resolution. As a result, it is possible to improve accuracy of an oscillation frequency of the atomic oscillator 30.

The coil 34 may be configured by a coil which is provided by being wound around an outer circumference of the atomic cell 31 so as to form a solenoid type. The coil 34 may be configured by a pair of coils which is provided so as to face each other through the atomic cell 31 in order to form a Helmholtz type.

The light source control unit 35 has a function of controlling the frequencies of the first resonance light and the second resonance light emitted from the light source unit 32, based on the detection result of the above-described light-receiving unit 33. The light source control unit 35 includes a frequency control unit 351, a voltage-controlled crystal oscillator (VCXO) 352, and a phase synchronization circuit (PLL) 353.

The frequency control unit 351 detects an EIT state in the atomic cell 31 based on the received-light intensity (light reception result) of the light-receiving unit 33, and outputs a control voltage in accordance with the detection result. Thus, the frequency control unit 351 controls the oscillation frequency of the voltage-controlled crystal oscillator 352 so as to cause the light-receiving unit 33 to detect an EIT signal.

The voltage-controlled crystal oscillator 352 is controlled by the frequency control unit 351, so as to have a desired oscillation frequency. For example, the voltage-controlled crystal oscillator 352 oscillates at a frequency of substantially several MHz to tens of MHz. That is, the voltage-controlled crystal oscillator 352 outputs a clock signal of a frequency f in accordance with a transition frequency of the atom in the atomic cell 31. The output signal of the voltage-controlled crystal oscillator 352 is input to the phase synchronization circuit 353 and is output as an output signal of the atomic oscillator 30. Instead of the voltage-controlled crystal oscillator 352, a voltage-controlled oscillator which does not use quartz crystal may be used.

The phase synchronization circuit 353 multiplies the frequency of an output signal from the voltage-controlled crystal oscillator 352, and outputs the signal obtained by the multiplication. The phase synchronization circuit 353 oscillates at a frequency which is ½ of a frequency corresponding to an energy difference $\Delta E$ between two different ground levels of the above-described alkali metal atom. A signal (high frequency signal) obtained by the multiplication in this manner is input to the light source unit 32, as a drive signal, in a state where a DC bias current is superimposed on this signal. Thus, modulation is performed for a light emitting element such as a semiconductor laser, which is included in the light source unit 32, and thus the first resonance light and the second resonance light which are two pieces of light of which a frequency difference $(\omega_1 - \omega_2)$ is $\omega_0$ can be emitted. Here, a current value of the DC bias current is controlled so as to be a predetermined value by a bias control unit (not illustrated). Thus, it is possible to control center wavelengths of the first resonance light and the second resonance light to be desired.

The magnetic field control unit 36 has a function of controlling electrification to the coil 34 in accordance with an output voltage (control voltage) of the loop filter 22. Thus, the coil 34 applies a magnetic field to the atom in the atomic cell 31 in accordance with the output voltage (control voltage) of the loop filter 22.

The atomic oscillator 30 which is configured as described above has uneven frequency-temperature characteristics in singleton. Thus, as illustrated in FIG. 1, the output signal (clock signal) of the atomic oscillator 30 is input to the DDS 60 and is corrected in accordance with an output (detected temperature) of the temperature sensor 40. Here, the DSP 23 performs processing of adjusting the setting value (correction value) of the DDS 60 based on the output of the temperature sensor 40. Frequency correction of the clock signal of the atomic oscillator 30 will be described later in detail.

If, for example, a situation (hold-over) in which receiving of a satellite signal by the GPS receiver 10 is not possible occurs, accuracy of 1 PPS output by the GPS receiver 10 is deteriorated or the GPS receiver 10 stops an output of 1 PPS. In such a case, the processing unit 20 stops processing of synchronizing the clock signal output by the atomic oscillator 30, with 1 PPS output by the GPS receiver 10 (also referred to as "GPS lock" below). Then, the processing unit 20 causes the atomic oscillator 30 to perform self-running and oscillation. If the atomic oscillator 30 performs self-running and oscillation, even when the accuracy of 1 PPS output by the GPS receiver 10 is deteriorated, the timing signal generation device 1 can output 1 PPS which is obtained by self-running and oscillation of the atomic oscillator 30, and has high frequency accuracy. As described above, even when the timing signal generation device 1 is in a situation in which an output of the reference timing signal by the GPS receiver 10 is not possible, it is possible to generate a highly precise timing signal by using the clock signal from the atomic oscillator 30. Even when a crystal oscillator such as an oven-controlled crystal oscillator (OCXO) of double ovens or a single oven, a voltage-controlled crystal oscillator (VCXO), and a crystal oscillation circuit with a temperature compensation circuit (TCXO) is used instead of the atomic oscillator 30, it is possible to output 1 PPS having high frequency accuracy, by self-running and oscillation.

Temperature Sensor

The temperature sensor 40 illustrated in FIG. 1 is disposed in the vicinity of the atomic oscillator 30. The temperature sensor 40 has a function of outputting a signal depending on the temperature of the atomic oscillator 30 (temperature of an installation environment). Thus, it is possible to detect the temperature of the atomic oscillator 30 based on an output of the temperature sensor 40. The temperature sensor 40 includes a thermocouple, a thermistor, for example.

DDS (Frequency Conversion Unit)

The DDS 60 illustrated in FIG. 1 has a function of performing frequency conversion (frequency modulation) on the clock signal from the atomic oscillator 30 (that is, the clock signal from the above-described voltage-controlled crystal oscillator 352) in accordance with the correction value (setting value) from the DSP 23. An output of the DDS 60 (clock signal of the corrected frequency f') is output as an output of the timing signal generation device 1, to the outside of the device 1 from the output unit 70. The DDS 60 will be described later in detail, along with descriptions for frequency correction (which will be described later) of the clock signal of the atomic oscillator 30.

Storage Unit

The storage unit 80 illustrated in FIG. 1 has a function of storing various types of information required for operating the processing unit 20. In particular, the storage unit 80 stores correction information regarding the frequency-temperature characteristics of the atomic oscillator 30.

Hitherto, the configuration of the timing signal generation device 1 is described.

Frequency Correction of Clock Signal of Atomic Oscillator

Frequency correction of the clock signal of the atomic oscillator 30 will be described below in detail.

Figure 6:
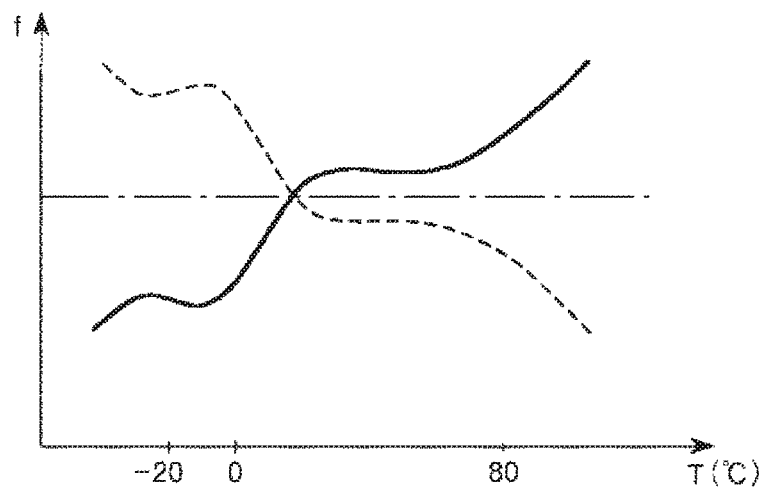
FIG. 6 is a graph illustrating an example of frequency-temperature characteristics of the atomic oscillator illustrated in FIG. 3.

FIG. 6 is a graph illustrating an example of the frequency-temperature characteristics of the atomic oscillator illustrated in FIG. 3.

For example, the atomic oscillator 30 has uneven frequency-temperature characteristics (fluctuation characteristics of an output frequency with respect to a change of a temperature) as indicated by a solid line in FIG. 6. Thus, if any correction is not performed, the clock signal of the atomic oscillator 30 may fluctuate due to a change of the temperature in an installation environment of the atomic oscillator 30. Here, in addition to a time (during hold-over) when the atomic oscillator 30 is caused to perform self-running and oscillation, as described above, during GPS lock, even when the phase comparator 21, the loop filter 22, the DSP 23, and the divider 24 perform synchronization of phase between the reference timing signal from the GPS receiver 10, and the clock signal from the atomic oscillator 30, for example, in a case where the temperature in the installation environment of the atomic oscillator 30 is changed rapidly faster than a response speed to a control signal of the atomic oscillator 30, an influence of the frequency-temperature characteristics as described above is shown. Thus, the clock signal of the atomic oscillator 30 fluctuates. When the atomic oscillator 30 is caused to perform self-running and oscillation, correction (will be described later) to which frequency aging characteristics are applied is separately performed, and thus it is possible to improve frequency characteristics.

Figure 7:
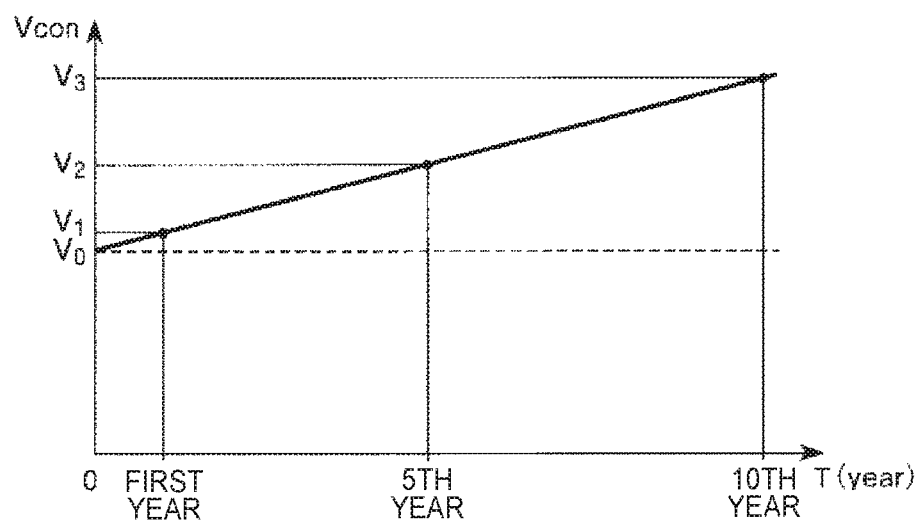
FIG. 7 is a graph illustrating an example of time variation (aging characteristics) of a control voltage of the atomic oscillator illustrated in FIG. 3.

FIG. 7 is a graph illustrating an example of time variation (aging characteristics) of a control voltage of the atomic oscillator illustrated in FIG. 3.

The atomic oscillator 30 has characteristics in which an output frequency f is changed in time even when the voltage value (control voltage) $V_{con}$ is set to be constant. That is, the atomic oscillator 30 has frequency aging characteristics. Thus, when the output frequency f of the atomic oscillator 30 is set to be constant, as illustrated in FIG. 7, the voltage value (control voltage) $V_{con}$ is changed in time, due to the frequency aging characteristics. For example, the voltage value $V_{con}$ is gradually increased for a period from the beginning to the 10th year, in an order of a voltage value $V_0$ at the beginning, a voltage value $V_1$ at the first year, a voltage value $V_2$ at the fifth year, and a voltage value $V_3$ at the 10th year. The frequency aging characteristics illustrated in FIG. 7 is just an example, and is not limited to linear increase. For example, the frequency aging characteristics may be linearly decreased, or may be increased or decreased in the second order curve.

Figure 8:
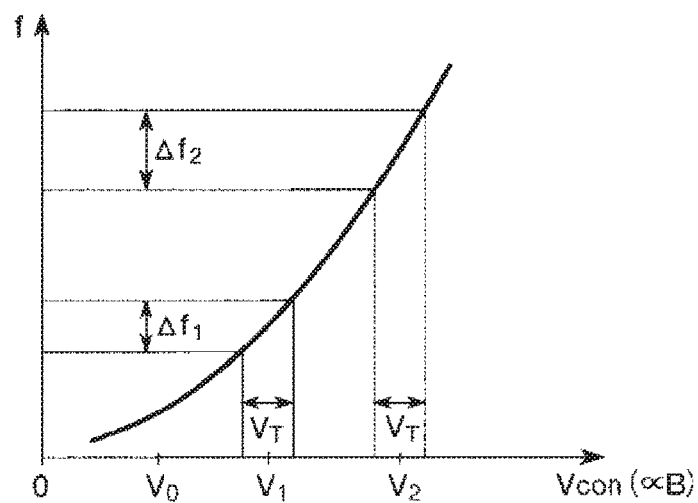
FIG. 8 is a graph illustrating a relationship between the control voltage and an oscillation frequency of the atomic oscillator illustrated in FIG. 3.

FIG. 8 is a graph illustrating a relationship between the control voltage and the oscillation frequency of the atomic oscillator illustrated in FIG. 3.

As described above, in the atomic oscillator 30, the voltage value $V_{con}$ to be input to the coil 34 is adjusted, so as to adjust the output frequency f. At this time, the output frequency f of the atomic oscillator 30 is increased in proportion to the square of the magnetic field from the coil 34. Thus, as illustrated in FIG. 8, the output frequency f of the atomic oscillator 30 is increased in proportion to the square of the voltage value (control voltage) $V_{con}$. Accordingly, linearity of a change of the output frequency to the control voltage of the atomic oscillator 30 is low. For example, when the voltage value $V_{con}$ is adjusted to be in a range of $V_T$, a range $\Delta f_1$ of adjusting the output frequency f in a case of performing adjustment with $V_1$ as the center is different from a range $\Delta f_2$ of adjusting the output frequency f in a case of performing adjustment with $V_2$ as the center. $V_2$ is different from $V_1$. Here, for example, $V_1$ is a voltage value $V_{con}$ at the first year illustrated in FIG. 7. $V_2$ is a voltage value $V_{con}$ at the fifth year illustrated in FIG. 7.

From the above descriptions, if the voltage value $V_{con}$ to be input to the coil 34 is adjusted, and thus the frequency-temperature characteristics are corrected, correction accuracy of the frequency-temperature characteristics is deteriorated with time, due to aging characteristics, or huge correction data for the frequency-temperature characteristics to which the aging characteristics are applied is necessarily held. In addition, complex control is needed.

Thus, in the embodiment, as illustrated in FIG. 1, the DDS 60 is provided between the atomic oscillator 30 and the output unit 70. Frequency conversion is performed on the clock signal from the atomic oscillator 30, by the DDS 60, and thus fluctuation of an output frequency of the timing signal generation device 1 occurring by the frequency-temperature characteristics of the atomic oscillator 30 is reduced. Thus, it is possible to reduce the fluctuation of an output frequency of the timing signal generation device 1 occurring by the frequency-temperature characteristics (fluctuation characteristics of an output frequency with respect to a change of a temperature) of the atomic oscillator 30.

In particular, since the DDS 60 converts the frequency of the clock signal of the atomic oscillator 30, even though the linearity of the output frequency to the voltage value (control voltage) which is input to the atomic oscillator 30 is bad, it is possible to easily correct the output frequency of the timing signal generation device 1 with high precision for a long term. Thus, even when temperature fluctuation under an installation environment occurs, it is possible to generate a clock signal as a highly-precise timing signal, for a long term.

In the embodiment, the DDS 60 is provided between the atomic oscillator 30 and the output unit 70, and thus it is possible to output the corrected clock signal as the timing signal from the output unit 70, with a relatively simple configuration.

Here, the DSP 23 inputs the correction value to the DDS 60 based on the output of the temperature sensor 40, so as to adjust the setting value of the DDS 60. At this time, the DSP 23 determines the correction value depending on the output of the temperature sensor 40, based on the correction information regarding the frequency-temperature characteristics, which is stored in the storage unit 80, and on the output of the temperature sensor 40. Thus, the DDS 60 converts the frequency (modulates the frequency) of the clock signal from the atomic oscillator 30, in accordance with the adjusted setting value. Then, the DDS 60 outputs the signal having the converted frequency. In this manner, the DSP 23 controls the DDS 60 based on the correction information in the storage unit 80 and the output of the temperature sensor 40, and thus it is possible to accurately correct the clock signal in accordance with the frequency-temperature characteristics of the atomic oscillator 30.

The correction information which relates to the frequency-temperature characteristics, and is stored in the storage unit 80 may be information in accordance with the above-described frequency-temperature characteristics as indicated by a solid line in FIG. 6. The correction information may be information in accordance with characteristics as indicated by a broken line (line segment symmetric to the solid line illustrated in FIG. 6, based on a flat line segment indicated by a one-dot chain line in FIG. 6) in FIG. 6. Such information has a format, for example, like a conversion table in which the temperature and the correction value correspond to each other.

Figure 9:
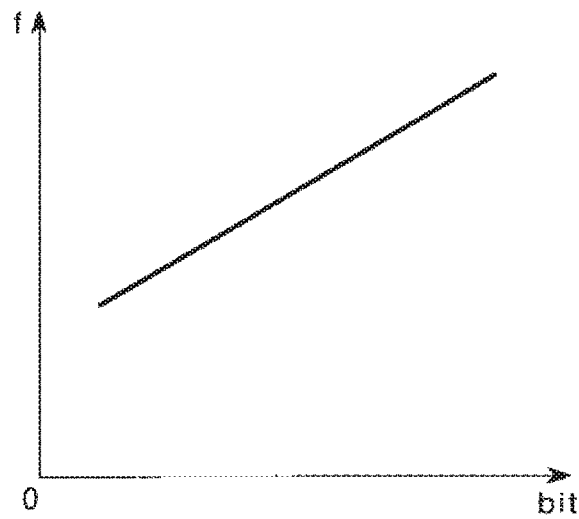
FIG. 9 is a graph illustrating a relationship between a setting value (correction value) and a frequency of an output signal of a frequency conversion unit (DDS) illustrated in FIG. 1.

FIG. 9 is a graph illustrating a relationship between the setting value (correction value) and the frequency of the output signal of the frequency conversion unit (DDS) illustrated in FIG. 1.

As illustrated in FIG. 9, the DDS 60 has high linearity of a change of the frequency to the setting value, since the output frequency is increased in proportion to the setting value (correction value). Thus, the DDS 60 (direct digital synthesizer) can convert the frequency of the clock signal from the atomic oscillator 30, so as to perform correction with simplicity and high accuracy.

According to the above-described timing signal generation device 1, the DSP 23 controls the DDS 60 (adjusts the correction value) based on the output of the temperature sensor 40, and thus it is possible to reduce fluctuation of the output frequency of the timing signal generation device 1, occurring by the frequency-temperature characteristics of the atomic oscillator 30 (fluctuation characteristics of an output frequency with respect to a change of a temperature). In particular, since the DDS 60 converts the frequency of the clock signal of the atomic oscillator 30, even though the linearity of the output frequency to the voltage value (control voltage) which is input to the atomic oscillator 30 is bad, it is possible to easily correct the frequency-temperature characteristics of the atomic oscillator 30 with high precision for a long term. Thus, even when temperature fluctuation under an installation environment occurs, it is possible to generate a clock signal as a highly-precise timing signal, for a long term.

Second Embodiment

Next, a second embodiment according to the invention will be described.

Figure 10:
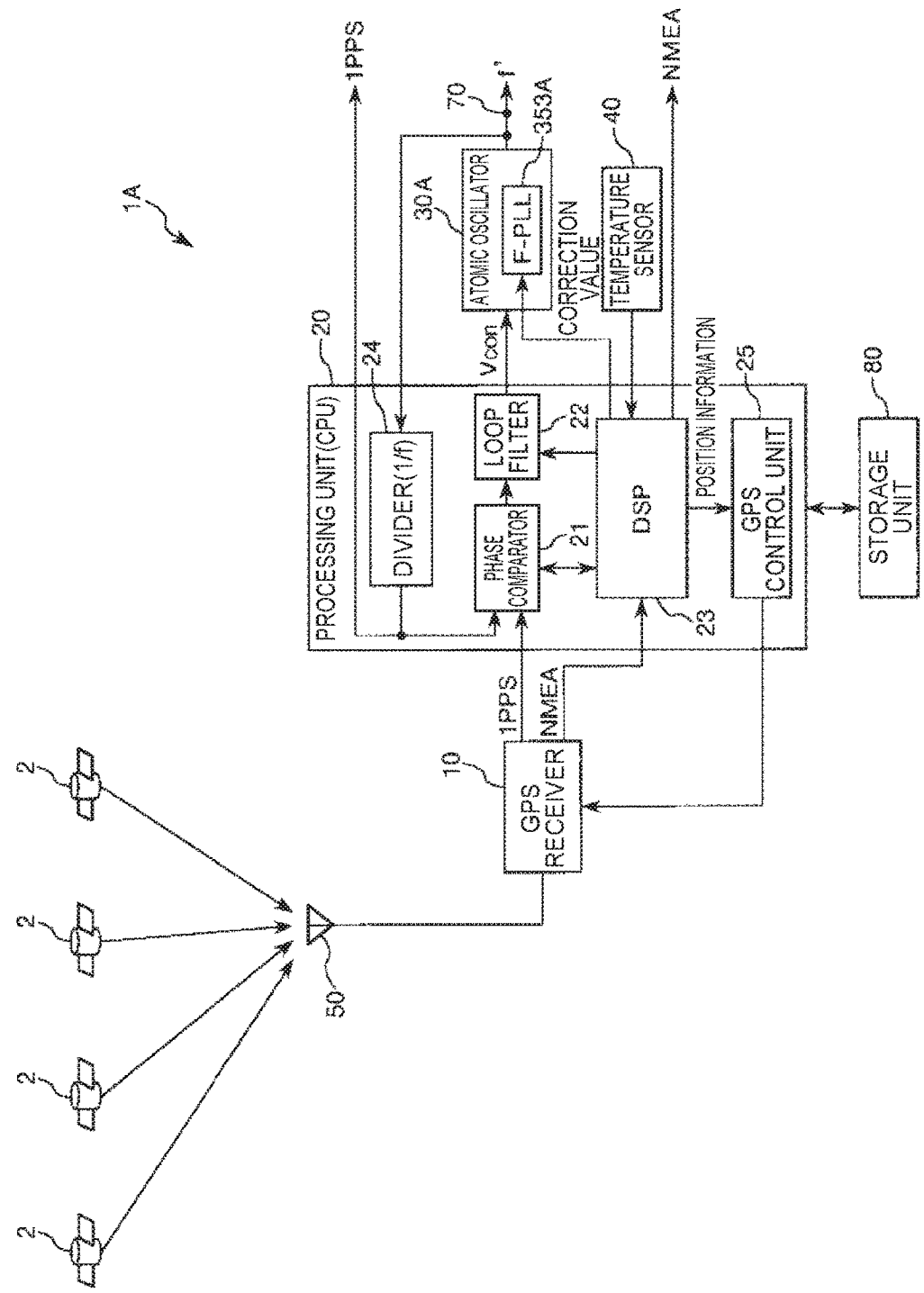
FIG. 10 is a schematic diagram illustrating a configuration of a timing signal generation device according to a second embodiment of the invention.
Figure 11:
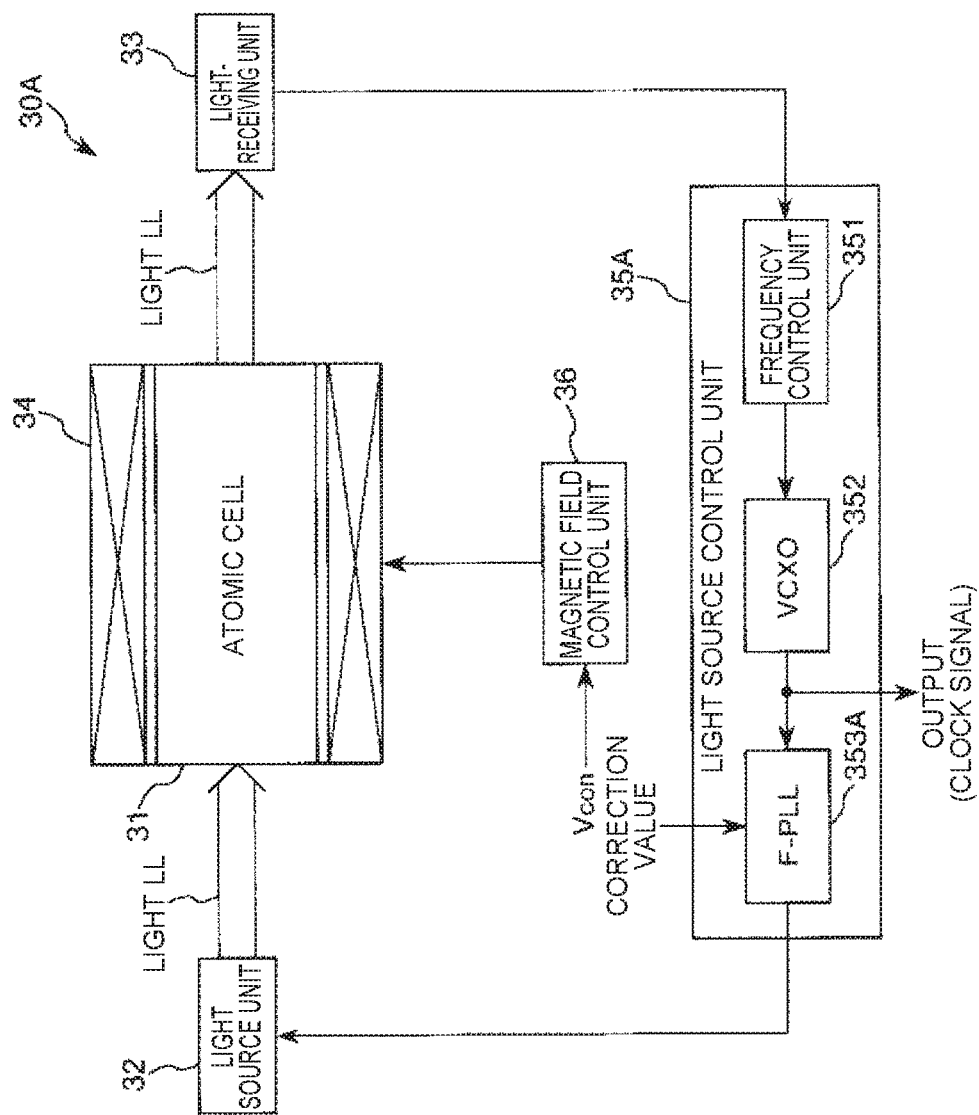
FIG. 11 is a schematic configuration diagram illustrating an atomic oscillator provided in the timing signal generation device illustrated in FIG. 10.

FIG. 10 is a schematic diagram illustrating a configuration of a timing signal generation device according to a second embodiment of the invention. FIG. 11 is a schematic configuration diagram illustrating an atomic oscillator in the timing signal generation device illustrated in FIG. 10.

This embodiment is similar to the above-described first embodiment except for a different configuration of the frequency conversion unit.

In the following descriptions, descriptions relating to the second embodiment will be made focused on different points from the above-described embodiment, and descriptions for similar items will be omitted. In FIGS. 10 and 11, components similar to those in the above-described embodiment are denoted by the same reference signs.

A timing signal generation device 1A illustrated in FIG. 10 includes an atomic oscillator 30A. As illustrated in FIG. 11, the atomic oscillator 30A includes a light source control unit 35A. The light source control unit 35A includes a frequency control unit 351, a voltage-controlled crystal oscillator 352, and a phase synchronization circuit 353A.

The phase synchronization circuit 353A corresponds to "a multiplying unit" that multiplies a clock signal from the voltage-controlled crystal oscillator 352, and outputs a signal obtained by the multiplication. An output of the phase synchronization circuit 353A is input to the light source unit 32. Thus, the light source unit 32 is driven by using the output of the phase synchronization circuit 353A.

In particular, the phase synchronization circuit 353A has a function of performing frequency conversion (frequency modulation) on the clock signal from the voltage-controlled crystal oscillator 352, in accordance with the correction value (setting value) from the DSP 23. Thus, it is possible to output the corrected clock signal from the atomic oscillator.

The phase synchronization circuit 353A is a fractional phase synchronization circuit. Thus, it is possible to convert the frequency of the clock signal so as to correct the clock signal with simplicity and high accuracy.

With the above-described timing signal generation device 1A according to this embodiment, it is possible to generate a highly precise timing signal for a long term even though temperature fluctuation under an installation environment occurs.

Third Embodiment

Next, a third embodiment according to the invention will be described.

Figure 12:
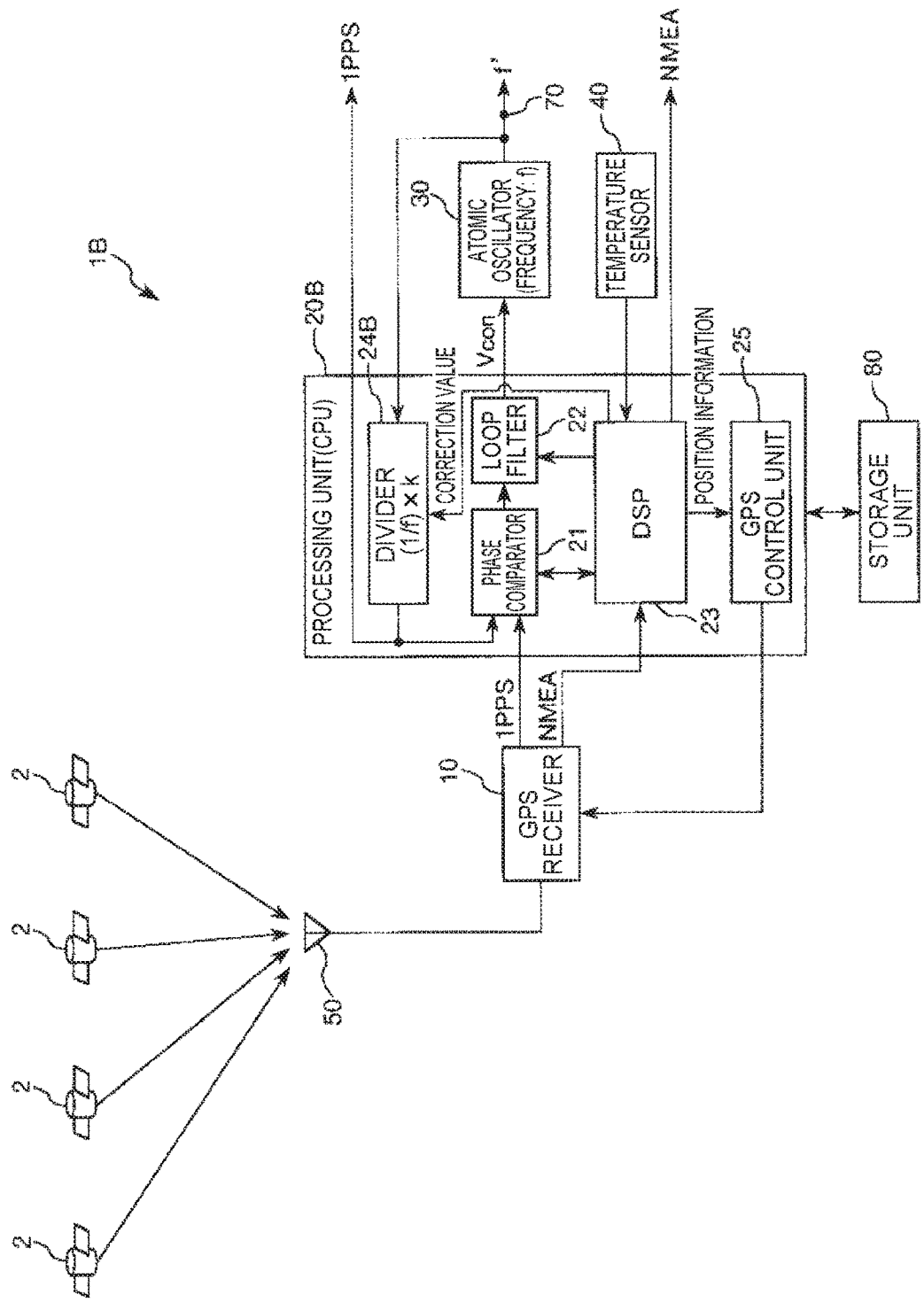
FIG. 12 is a schematic diagram illustrating a configuration of a timing signal generation device according to a third embodiment of the invention.

FIG. 12 is a schematic diagram illustrating a configuration of a timing signal generation device according to a third embodiment of the invention.

This embodiment is similar to the above-described first embodiment except for a different configuration of the frequency conversion unit.

In the following descriptions, descriptions relating to the third embodiment will be made focused on different points from the above-described embodiment, and descriptions for similar items will be omitted. In FIG. 12, components similar to those in the above-described embodiment are denoted by the same reference signs.

A timing signal generation device 1B illustrated in FIG. 12 includes a processing unit 20B which includes a divider 24B. Here, the phase comparator 21, the loop filter 22, the DSP 23, and the divider 24B function as "a voltage adjustment unit". The voltage adjustment unit adjusts a voltage value input to the atomic oscillator 30, in accordance with a synchronization status between the reference timing signal from the GPS receiver 10 and the clock signal from the atomic oscillator 30.

The divider 24B divides and outputs the clock signal from the atomic oscillator 30. In particular, the divider 24B has a varying division ratio. The divider 24B has a function of performing frequency conversion (frequency modulation) on the clock signal from the atomic oscillator 30, in accordance with the correction value (setting value) from the DSP 23. For example, the divider 24B performs k×f division (here, k is a coefficient depending on the correction value) of the clock signal (frequency: f) output by the atomic oscillator 30, and outputs a division clock signal of 1 Hz. Thus, it is possible to output the corrected clock signal from the atomic oscillator 30, with a relatively simple configuration.

With the above-described timing signal generation device 1B according to this embodiment, it is possible to generate a highly precise timing signal for a long term even though temperature fluctuation under an installation environment occurs.

2. Electronic Device

Next, an embodiment of an electronic device according to the invention will be described.

Figure 13:
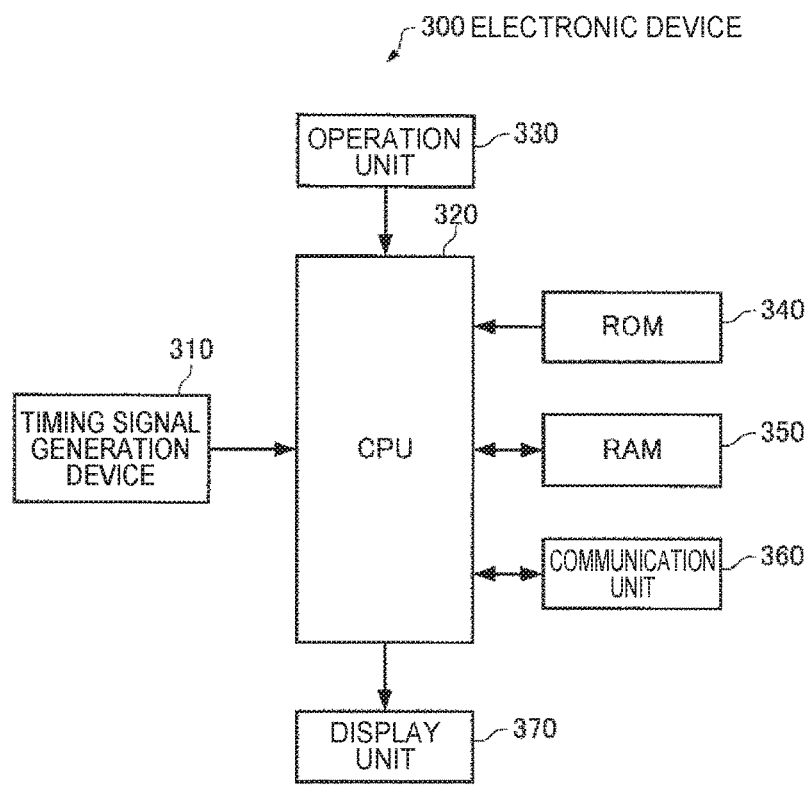
FIG. 13 is a block diagram illustrating an embodiment of an electronic device according to the invention.

FIG. 13 is a block diagram illustrating the embodiment of the electronic device according to the invention.

The electronic device 300 illustrated in FIG. 13 includes a timing signal generation device 310, a central processing unit (CPU) 320, an operation unit 330, a read only memory (ROM) 340, a random access memory (RAM) 350, a communication unit 360, and a display unit 370.

The timing signal generation device 310 is applied as the above-described timing signal generation device 1, for example. As described before, the timing signal generation device 310 receives a satellite signal and generates a timing signal (1 PPS) having high precision, and outputs the generated timing signal outwardly. Thus, it is possible to realize the electronic device 300 with lower cost and high reliability.

The CPU 320 performs various types of calculation processing or control processing, in accordance with a program stored in the ROM 340 and the like. Specifically, the CPU 320 performs types of processing with synchronization with the timing signal (1PPS) or a clock signal which is output by the timing signal generation device 310. Examples of the performed processing include clocking processing, various types of processing performed in accordance with an operation signal from the operation unit 330, processing of controlling the communication unit 360 so as to perform data communication with the outside of the electronic device, and processing of transmitting a display signal so as to display various types of information on the display unit 370.

The operation unit 330 is an input device configured by operation keys, button switches, or the like. The operation unit 330 outputs an operation signal to the CPU 320 in accordance with an operation by a user.

The ROM 340 stores a program, data, or the like required for causing the CPU 320 to perform various types of calculation processing or control processing.

The RAM 350 is used as a work area of the CPU 320. The RAM 350 temporarily stores a program or data which has been read from the ROM 340, data input from the operation unit 330, computation results obtained by performing of the CPU 320 in accordance with various programs, and the like.

The communication unit 360 performs various types of processing for establishing data communication between the CPU 320 and an external device.

The display unit 370 is a display device configured by a liquid crystal display (LCD) and the like. The display unit 370 displays various types of information based on a display signal input from the CPU 320. A touch panel that functions as the operation unit 330 may be provided in the display unit 370.

Various electronic devices are considered as such an electronic device 300, and the electronic device 300 is not particularly limited. For example, a server (time server) for managing points of time, in which synchronization with a reference point of time is realized, a time management device (time stamp server) that performs issue of a time stamp, and the like, a frequency reference device such as a base station are exemplified.

3. Moving Object

Figure 14:
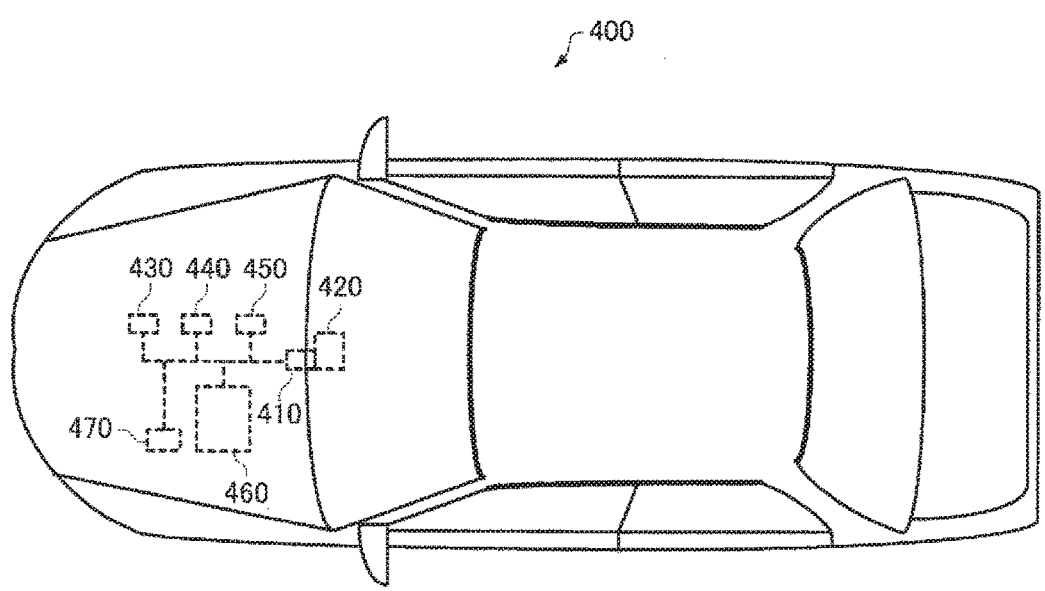
FIG. 14 is a diagram illustrating an embodiment of a moving object according to the invention.

FIG. 14 is a diagram illustrating an embodiment of the moving object according to the invention.

A moving object 400 illustrated in FIG. 14 includes a timing signal generation device 410, a car navigation device 420, controllers 430, 440, and 450, a battery 460, and a backup battery 470.

The above-described timing signal generation device 1 may be applied as the timing signal generation device 410. The timing signal generation device 410 performs the positioning calculation in real-time in the normal positioning mode, and outputs 1 PPS, a clock signal, and NMEA data, for example, when the moving object 400 is moving. For example, when the moving object 400 stops, the timing signal generation device 410 performs the positioning calculation a plurality of times in the normal positioning mode. Then, the timing signal generation device 410 sets the most frequent value or the median value of results obtained by performing the positioning calculation the plurality of times, as the current position information, and outputs 1PPS, a clock signal, and NMEA data in the position fix mode.

The car navigation device 420 is synchronized with 1 PPS or the clock signal which is output by the timing signal generation device 410, and displays the position or the point of time thereof, or other various types of information on a display by using the NMEA data which is output by the timing signal generation device 410.

The controllers 430, 440, and 450 perform various controls for an engine system, a brake system, a keyless entry system, and the like. The controllers 430, 440, and 450 may perform various controls with synchronization with a clock signal output by the timing signal generation device 410.

The moving object 400 in the embodiment includes the timing signal generation device 410, and thus it is possible to ensure high reliability in the middle of moving and stopping.

Various moving objects are considered as such a moving object 400. Examples of the moving object 400 include an automobile (also including an electric automobile), an aircraft such as a jet aircraft or a helicopter, a watercraft, a rocket, a satellite, and the like.

Hitherto, the timing signal generation device, the electronic device, and the moving object according to the invention are described based on the embodiment illustrated in the drawings. However, the invention is not limited thereto.

The configuration in the embodiment of the invention may be substituted with any configuration showing similar functions of the above-described embodiment. Any other constituents may be added.

In the above-described embodiment, a timing signal generation device using a GPS is exemplified. However, a global navigation satellite system (GNSS) except for the GPS, that is, for example, Galileo, GLONASS, or the like may be used.

What is claimed is:

1. A timing signal generation device comprising:
    a reference timing signal output unit that outputs a reference timing signal;
    an atomic oscillator that outputs a clock signal in accordance with an input voltage value;
    a voltage adjustment unit that adjusts the voltage value in accordance with a synchronization status between the reference timing signal and the clock signal;
    a temperature sensor that outputs a signal depending on the temperature of the atomic oscillator;
    a frequency conversion unit that converts a frequency of the clock signal, and outputs a signal obtained by the frequency conversion; and wherein the voltage adjustment unit controls the frequency conversion unit based on an output of the temperature sensor.

2. The timing signal generation device according to claim 1, wherein
the atomic oscillator includes
an atomic cell in which an atom is enclosed,
a coil which applies a magnetic field to the atom in accordance with the voltage value, and
an voltage-controlled oscillator which outputs the clock signal in accordance with a transition frequency of the atom.

3. The timing signal generation device according to claim 2, further comprising:
an output unit that outputs a timing signal outwardly, wherein
the frequency conversion unit is provided between the atomic oscillator and the output unit.

4. The timing signal generation device according to claim 3, wherein
the frequency conversion unit is a direct digital synthesizer.

5. The timing signal generation device according to claim 2, wherein
the atomic oscillator includes
a light source unit that emits a resonance light pair for exciting the atom,
a light-receiving unit that receives the resonance light pair which has passed through the atomic cell,
a frequency control unit that controls an oscillation frequency of the voltage-controlled oscillator based on a light reception result of the light-receiving unit, and
a multiplying unit that multiplies the clock signal and outputs a signal obtained by multiplying the clock signal,
the light source unit is driven by using an output of the multiplying unit, and
the frequency conversion unit is provided in the multiplying unit.

6. The timing signal generation device according to claim 5, wherein
the frequency conversion unit is a fractional phase synchronization circuit.

7. The timing signal generation device according to claim 2, wherein
the voltage adjustment unit includes
a divider that divides and outputs the clock signal,
a phase comparator that compares a phase of an output of the divider and a phase of the reference timing signal, and
a loop filter which is provided between the phase comparator and the atomic oscillator, and
the frequency conversion unit is provided in the divider.

8. The timing signal generation device according to claim 1, further comprising:
a storage unit that stores correction information regarding frequency-temperature characteristics of the atomic oscillator,
wherein
the voltage adjustment unit controls the frequency conversion unit based on the correction information and the output of the temperature sensor.

9. The timing signal generation device according to claim 1, wherein
the reference timing signal output unit outputs the reference timing signal based on a satellite signal.

10. An electronic device comprising:
the timing signal generation device according to claim 1.

11. An electronic device comprising:
the timing signal generation device according to claim 2.

12. An electronic device comprising:
the timing signal generation device according to claim 3.

13. An electronic device comprising:
the timing signal generation device according to claim 4.

14. An electronic device comprising:
the timing signal generation device according to claim 5.

15. An electronic device comprising:
the timing signal generation device according to claim 6.

16. A moving object comprising:
the timing signal generation device according to claim 1.

17. A moving object comprising:
the timing signal generation device according to claim 2.

18. A moving object comprising:
the timing signal generation device according to claim 3.

19. A moving object comprising:
the timing signal generation device according to claim 4.

20. A moving object comprising:
the timing signal generation device according to claim 5.

* * * * *